United States Patent
Akatsu et al.

(10) Patent No.: US 6,887,761 B1
(45) Date of Patent: May 3, 2005

(54) VERTICAL SEMICONDUCTOR DEVICES

(75) Inventors: Hiroyuki Akatsu, Yorktown Heights, NY (US); Thomas W. Dyer, Pleasant Valley, NY (US); Ravikumar Ramachandran, Pleasantville, NY (US); Kenneth T. Settlemyer, Jr., Poughquag, NY (US)

(73) Assignees: International Business Machines Corporation, Armonk, NY (US); Infineon Technologies North America Corp., San Jose, CA (US)

( * ) Notice: Subject to any disclaimer, the term of this patent is extended or adjusted under 35 U.S.C. 154(b) by 0 days.

(21) Appl. No.: 10/708,647

(22) Filed: Mar. 17, 2004

(51) Int. Cl.[7] .......................... H01L 21/336; H01I 29/76
(52) U.S. Cl. ...................... 438/270; 438/242; 438/246; 257/301; 257/302
(58) Field of Search ................................ 438/213, 242, 438/243, 246, 268, 270, 386, 389; 257/296, 298, 300, 301, 302

(56) References Cited

U.S. PATENT DOCUMENTS

| | | | | |
|---|---|---|---|---|
| 5,937,292 A | * | 8/1999 | Hammerl et al. ........... 438/243 |
| 6,090,661 A | * | 7/2000 | Perng et al. ................ 438/248 |
| 6,100,131 A | * | 8/2000 | Alsmeier ..................... 438/243 |
| 6,326,261 B1 | * | 12/2001 | Tsang et al. ................ 438/243 |
| 6,362,040 B1 | * | 3/2002 | Tews et al. ................. 438/246 |
| 6,518,616 B2 | * | 2/2003 | Dyer et al. ................. 257/301 |
| 6,794,242 B1 | * | 9/2004 | Dyer et al. ................. 438/244 |

* cited by examiner

Primary Examiner—Kevin M. Picardat
(74) Attorney, Agent, or Firm—Schmeiser, Olsen & Watts; Steven Capella (57) ABSTRACT

A method and structure for increasing the threshold voltage of vertical semiconductor devices. The method comprises creating a deep trench in a substrate whose semiconductor material has an orientation plane perpendicular to the surface of the substrate. Then, vertical transistors are formed around and along the depth of the deep trench. Next, two shallow trench isolation are formed such that they sandwich the deep trench in an active region and the two shallow trench isolation regions abut the active region via planes perpendicular to the orientation plane. Then, the channel regions of the vertical transistors are exposed to the atmosphere in the deep trench and then chemically etched to planes parallel to the orientation plane. Then, a gate dielectric layer is formed on the wall of the deep trench. Finally, the deep trench is filled with poly-silicon to form the gate for the vertical transistors.

20 Claims, 6 Drawing Sheets

VERTICAL SEMICONDUCTOR DEVICES

BACKGROUND OF INVENTION

The present invention relates to semiconductor devices, and more particularly, to vertical semiconductor devices.

In the fabrication process of a conventional vertical transistor, shallow trench isolation (STI) regions are usually formed to isolate the vertical transistor from the surrounding devices. However, the formation of the STI regions is usually not perfectly aligned with the deep trench of the vertical transistor. As a result, the drain/source regions of the vertical transistor usually has sharp corners resulting in low threshold voltage (Vt) for the vertical transistor. Low Vt is undesirable because the vertical transistor may erroneously switch states in response to a small glitch on the input signal.

Therefore, there is a need for a structure of a novel vertical transistor which has Vt relatively higher than that of prior art. Also, there is a need for a method for fabricating the novel vertical transistor.

SUMMARY OF INVENTION

The present invention provides a method for fabricating a vertical semiconductor structure. The method comprises the steps of (a) providing a semiconductor substrate comprising a semiconductor material; (b) forming a deep trench in the semiconductor substrate; (c) depositing a first gate dielectric layer on a side wall of the deep trench; (d) filling the deep trench with a filling material; (e) forming a first source/drain region and a second source/drain region around and along the depth of the deep trench; (f) forming first and second shallow trench isolation regions sandwiching the deep trench in an active region, the first and second shallow trench isolation regions abutting the active region via first and second abutting surfaces, respectively, wherein the first and second abutting surfaces are parallel to each other and are perpendicular to an orientation plane of the semiconductor material of the substrate; (g) removing the first gate dielectric layer so as to expose the semiconductor material in the deep trench to the atmosphere; (h) chemically etching the exposed semiconductor material in the deep trench; (i) depositing a second gate dielectric layer on a side wall of the deep trench; and (i) forming a gate terminal for the vertical semiconductor structure in the deep trench.

The present invention also provides a vertical semiconductor structure, comprising (a) first and second shallow trench isolation regions formed in a substrate comprising a semiconductor material; and (b) a first vertical transistor formed in the substrate and sandwiched between the first and second shallow trench isolation regions, the first vertical transistor including first and second source/drain regions, a first channel region, a gate region, and a first gate dielectric layer sandwiched between the gate region and the first channel region, wherein the first channel region abuts the first and second shallow trench isolation regions via first and second abutting surfaces, respectively, and wherein the first and second abutting surfaces are perpendicular to an orientation plane of the semiconductor material of the substrate.

The present invention also provides a method for fabricating a vertical semiconductor structure. The method comprises the steps of (a) providing a semiconductor substrate comprising a semiconductor material; (b) forming a deep trench in the semiconductor substrate; (c) depositing a first gate dielectric layer on a wall of the deep trench; (d) filling the deep trench with a filling material and recessing the filling material in the deep trench down to a recess depth; (e) removing the first gate dielectric layer on a side wall of the deep trench down to a level lower than the recess depth; (f) filing the deep trench with poly silicon and recessing the poly silicon down to a level above the recess depth; (g) filling the deep trench with a second dielectric layer and selectively removing the dielectric on a wall of the deep trench so as to form a trench top dielectric layer; (h) filling the deep trench with poly silicon; (i) forming a first source/drain region and a second source/drain region around and along the depth of the deep trench; (j) forming first and second shallow trench isolation regions sandwiching the deep trench in an active region, the first and second shallow trench isolation regions abutting the active region via first and second abutting surfaces, respectively, wherein the first and second abutting surfaces are parallel to each other and are perpendicular to an orientation plane of the semiconductor material of the substrate; (k) removing the first gate dielectric layer so as to expose the semiconductor material in the deep trench to the atmosphere; (l) chemically etching the exposed semiconductor material in the deep trench; (m) depositing a second gate dielectric layer on a side wall of the deep trench; and (o) forming a gate terminal for the vertical semiconductor structure in the deep trench.

DETAILED DESCRIPTION

Figure 1A:
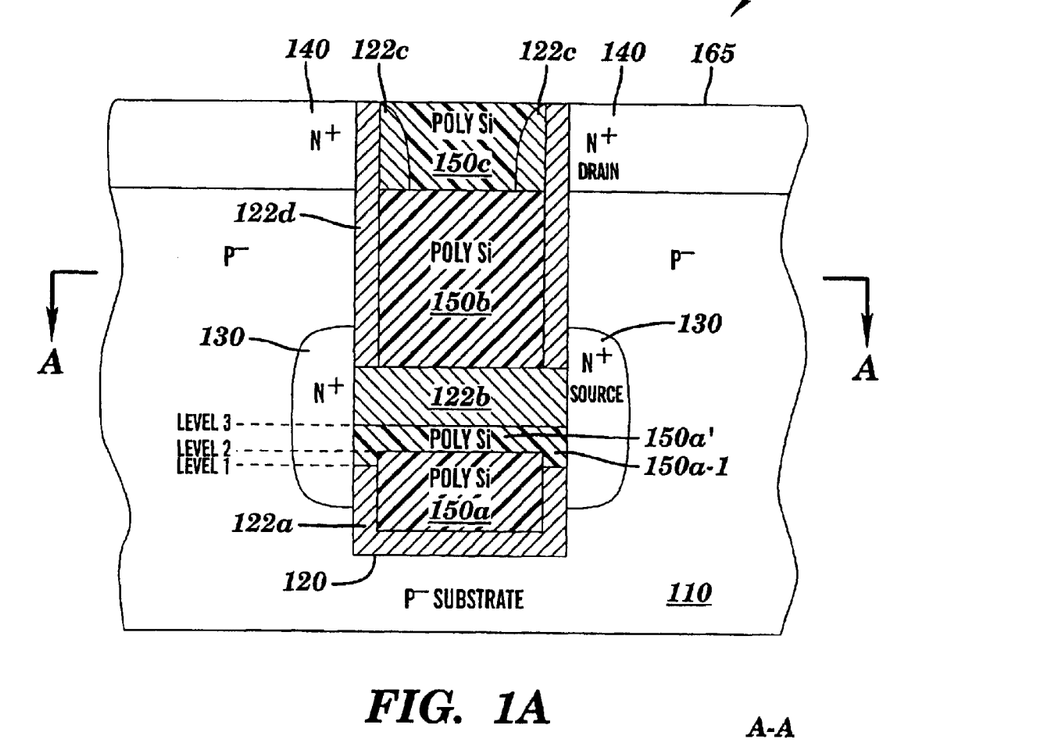
FIG. 1A illustrates a cross sectional view of an electronic structure, in accordance with embodiments of the present invention.

FIG. 1A illustrates a cross sectional view of an electronic structure 100, in accordance with embodiments of the present invention. Illustratively, the structure 100 comprises a P-silicon (Si) substrate 110, a storage node dielectric layer 122a, a trench top oxide layer 122b, a dielectric spacer 122c, poly Si regions 150a, 150a', 150b, and 150c, an n+ source region 130, and an n+ drain region 140.

In one embodiment, the structure 100 can be formed by first creating a cylindrical deep trench (DT) 120 in the substrate 110. Then, the storage node dielectric layer 122a is formed on the bottom wall and side wall of the cylindrical DT 120. Next, the DT 120 is completely filled with poly Si, and then some poly Si on top of the DT 120 is removed (recessing) down to level 2 to form the poly Si region 150a. Then, the storage node dielectric layer 122a is etched, removed from sidewall of the deep trench 120, and recessed down to level 1. Next, the DT 120 is partially or completely filled with poly Si, and then some poly Si on top of the DT 120 is removed down to level 3 to form the poly Si region 150a'.

Next, a thick dielectric layer is deposited into the DT 120 and then the dielectric material is selectively removed from the side wall of the DT 120 so as to form the trench top oxide layer 122b. Then the gate dielectric 122d is formed on the sidewall. Next, the poly Si region 150b is filling and recessing. Then, the dielectric spacer 122c is formed by deposition and etching. Next, the poly Si region 150c is formed by deposition and planarization.

Then, the n+ source region 130 is created around the DT 120 by thermal diffusion of dopants from the storage node poly Si regions 150a,150a through the groove 150a-1. In this manner, the n+ source region 130 is self-aligned to the recess depth (i.e., level 2), and capacitive overlap can be controlled with the gate poly Si 150b. Finally, the n+ drain region 140 is created around the DT 120 by ion implantation. As a result, the n+ source region 130 and the n+ drain region 140 are around and along the depth of the DT 120.

The structure 100 can be viewed as a vertical transistor 130,140,150b having the poly Si region 150b as its gate, the n+ source region 130 as its source, and the n+ drain region 140 as its drain. The gate dielectric layer 122d electrically isolates the gate region 150b and the source/drain regions 130 and 140 of the vertical transistor 130,140,150b.

The trench top oxide 122b serves to restrict the gate of the vertical transistor 130,140,150b to only the poly Si region 150b. The trench top oxide 122b also serves to isolate gate dielectric poly 150b from the storage node 150a,150a.

It should be noted that the transistor 130,140,150b is considered vertical because a current flowing from the n+ drain region 140 to the n+ source region 130 would follow along a path perpendicular to the top surface 165 of the substrate 110. The substrate 110 has two surfaces: a bottom surface and the top surface 165. The top surface 165 is where fabrication processes are directed.

Figure 1B:
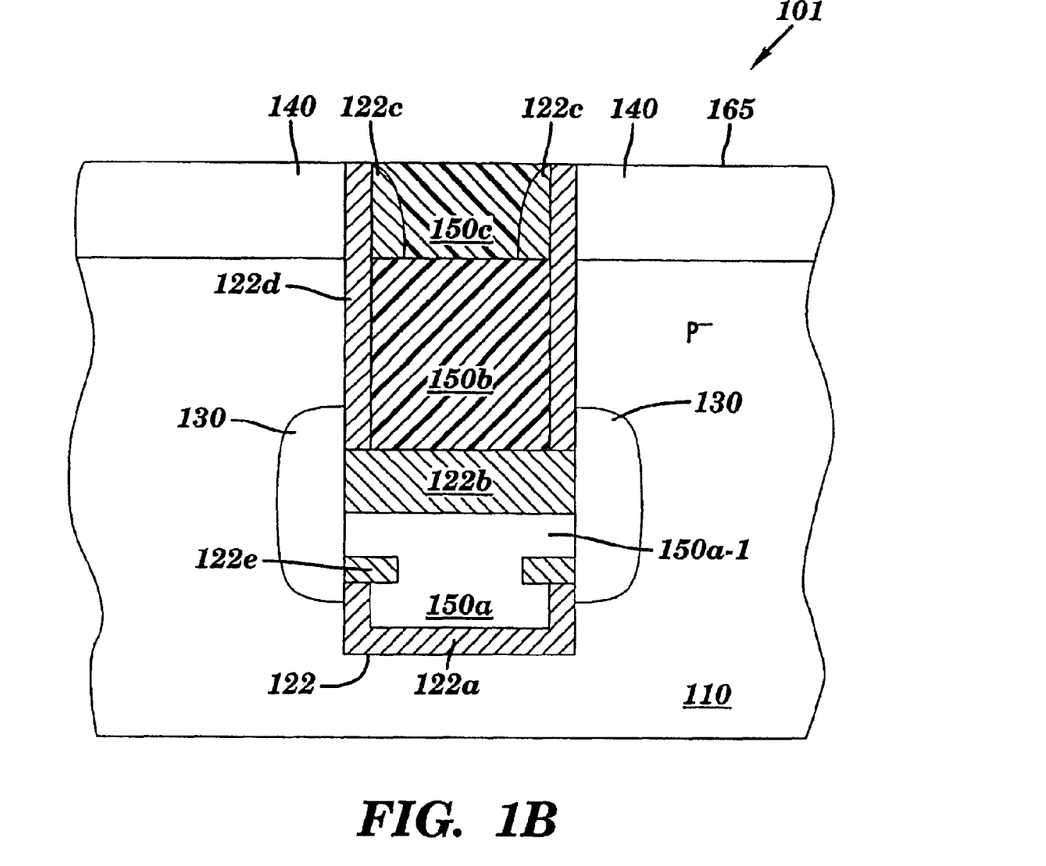
FIG. 1B illustrates a cross sectional view of another electronic structure, in accordance with embodiments of the present invention.

FIG. 1B illustrates a cross sectional view of another electronic structure 101, in accordance with embodiments of the present invention. The electronic structure 101 is similar to the electronic structure 100, except that the electronic structure 101 comprises a collar oxide 122e, which prevents the vertical leakage current from the diffusion region 130 along with the trench sidewall when the poly Si region 150a is charged positively, which inverts the p-substrate 110 through the dielectric 122a.

Figure 1C:
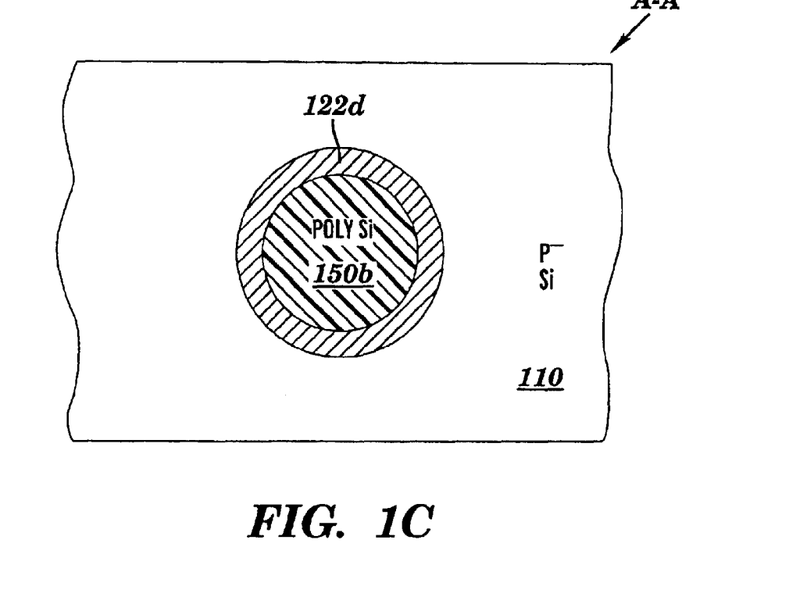
FIG. 1C illustrates a cut surface A—A of the structure of FIG. 1A.

FIG. 1C illustrates a cut surface A—A of the structure 100 of FIG. 1A. At center is the poly Si region 150b. Next is the gate dielectric layer 122d encircling the poly Si region 150b. Next is the P—Si substrate 110.

Figure 2:
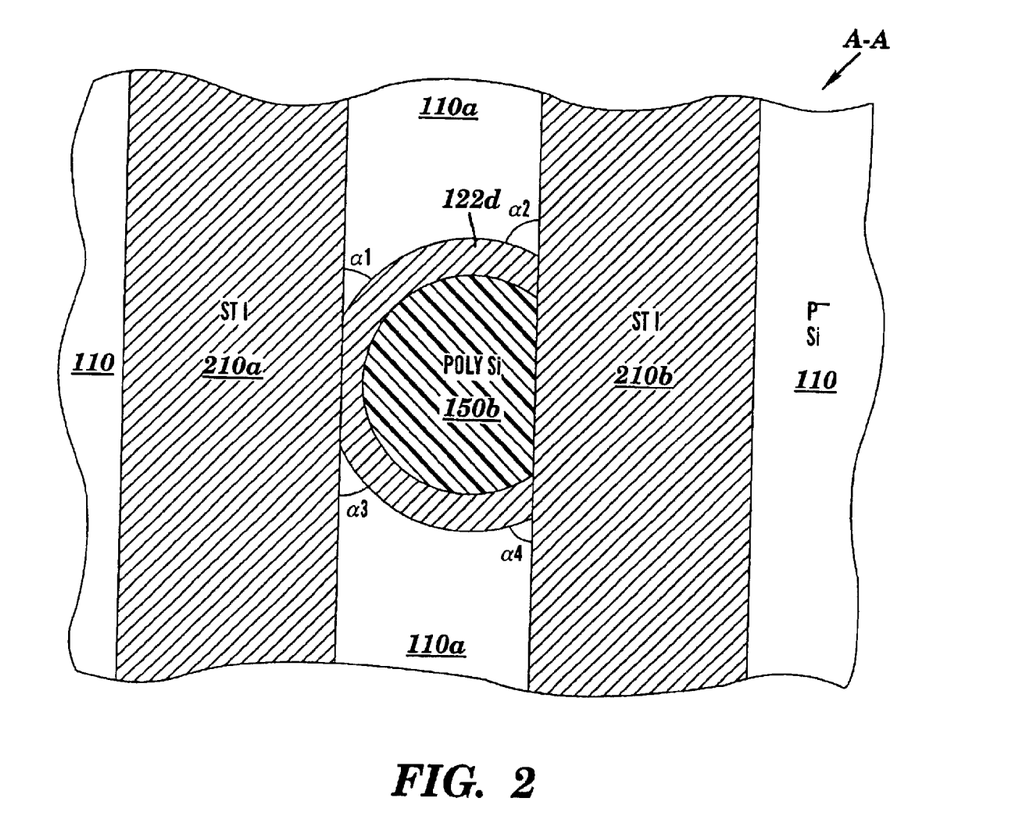
FIGS. 2–5 illustrates the structure of FIG. 1B going through different fabrication steps, in accordance with embodiments of the present invention.

FIGS. 2–5 illustrate the structure 100 of FIG. 1B as viewed at the cut surface A—A going through different fabrication steps, in accordance with embodiments of the present invention. More specifically, FIG. 2 illustrates the cut surface A—A of the structure 100 of FIG. 1B after two STI (shallow trench isolation) regions 210a and 210b comprising a dielectric material are formed in the substrate 110. The substrate region 110a sandwiched between the two STI regions 210a and 210b are called an active region.

In one embodiment, the two STI regions 210a and 210b are extended down past the n+ source region 130 such that the doughnut-shape n+ source region 130 is cut into two electrically isolated n+ source sub-regions (not shown). As a result, the vertical transistor 130,140,150b can be considered cut into two vertical transistors by the two STI regions 210a and 210b. The resulting two vertical transistors have the same poly Si gate region 150b, but have separate drain regions and have separate source regions (not shown).

Figure 3:
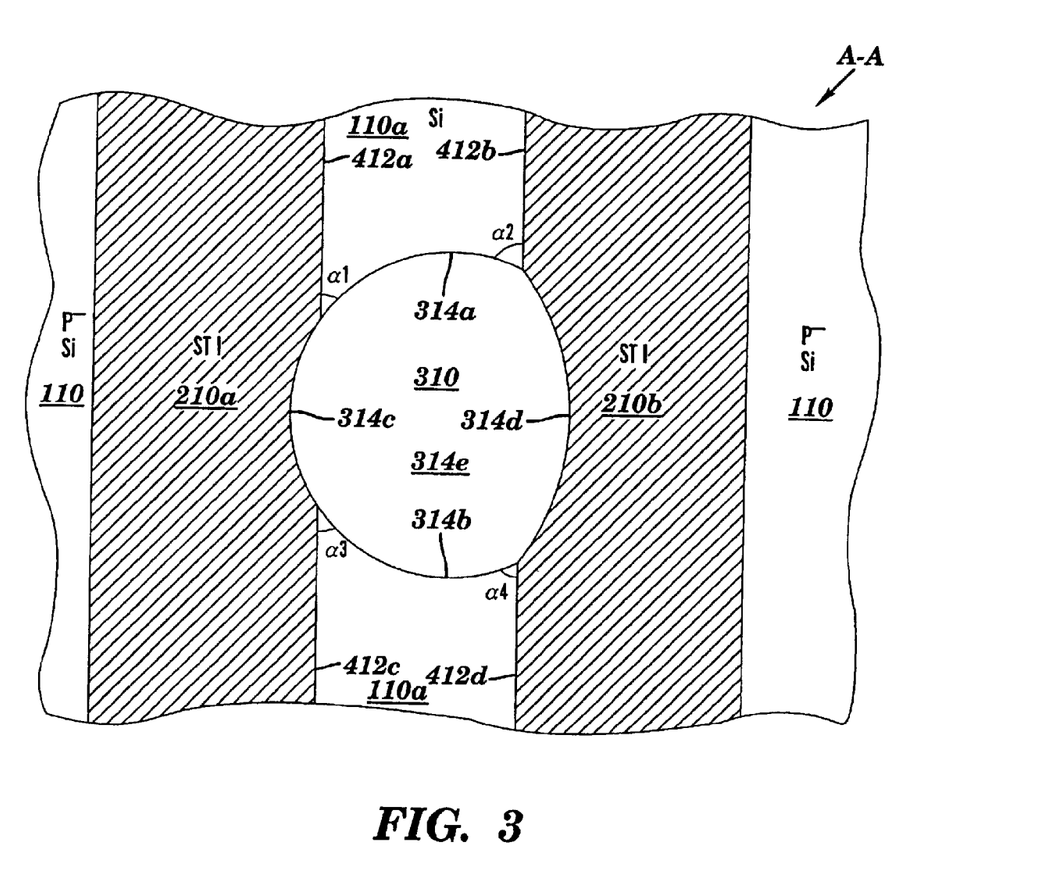

FIG. 3 illustrates the structure 100 of FIG. 2 as viewed at the cut surface A—A after the Si material of the substrate 110 is exposed on the north and south side walls 314a and 314b of the DT 120. More specifically, with reference to FIGS. 1A, 1C, 2, and 3, first the poly Si regions 150c and 150b are removed by etching. At this point, looking down the hole 310 created by the removal of the poly Si regions 150c and 150b, the trench top oxide layer 122b (FIG. 1A) can be seen exposed to the atmosphere at the bottom wall 314e of the hole 310. The gate dielectric layer 122d and the dielectric spacer 122c are exposed to the atmosphere on the side wall of the hole 310.

Next, dielectric etching is performed to remove dielectric materials from the side wall of the hole 310 until the Si regions are exposed to the atmosphere. In one embodiment, the STI regions 210a and 210b, the trench top oxide layer 122b, and the dielectric spacer 122c are much thicker than the gate dielectric layer 122d. As a result, with reference to FIG. 3, the bottom wall 314e, the west side wall 314c, and the east side wall 314d of the hole 310 are still dielectric materials after the dielectric etching. On the north side wall 314a and south side wall 314b of the hole 310, near the wafer surface 165, the dielectric spacer 122c is still present, but below the dielectric spacer 122c, the thinner dielectric layer 122d is gone and the Si material of the p-Si substrate 110 is exposed to the atmosphere.

Figure 4:
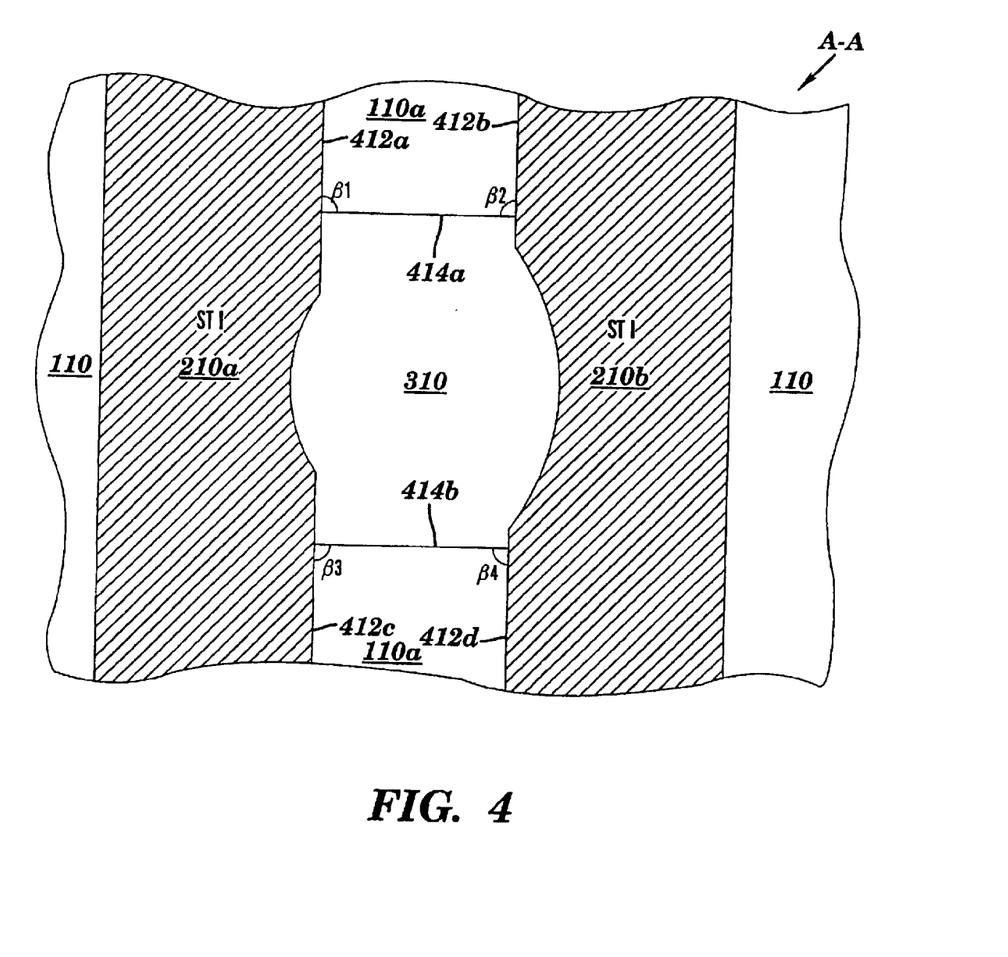

FIG. 4 illustrates the structure 100 of FIG. 3 as viewed at the cut surface A—A after some Si material is etched away from the north side wall 314a and south side wall 314b of the hole 310 (FIG. 3) such that the resulting north side wall 414a of the hole 310 is perpendicular to surfaces 412a and 412b of the two STI regions 210a and 210b, respectively, and such that the resulting south side wall 414b of the hole 310 is perpendicular to surfaces 412c and 412d of the two STI regions 210a and 210b, respectively.

Si material has a characteristic that when a surface of Si material is etched with a chemical etching agent such as $NH_4OH$, the resulting surface is always parallel to an imaginary plane called orientation plane, regardless of how much etching is performed on the initial surface. This characteristic is due to the crystal orientation of the Si crystal and its interaction with the electrochemical nature of the etch chemistry.

In one embodiment, the top surface 165 (FIG. 1A) of the substrate 110 is perpendicular to the orientation plane of the Si material of the substrate 110. In addition, in previous fabrication steps, the two STI regions 210a and 210b (FIG. 2) were formed such that their abutting surfaces 412a, 412b, 412c, and 412d (abutting the active region 110a) are parallel to each other and perpendicular to the orientation plane of the Si material of the substrate 110. As a result, with a chemical etching agent such as $NH_4OH$ being applied to the hole 310, the north side wall 314a and south side wall 314b of the hole 310 (FIG. 3) will recede and become north side wall 414a and south side wall 414b of the hole 310 (FIG. 4) wherein the north side wall 414a and south side wall 414b are both parallel to the orientation plane. Because the abutting surfaces 412a, 412b, 412c, and 412d are perpendicular to the orientation plane, the north side wall 414a and south side wall 414b are both perpendicular to abutting surfaces 412a, 412b, 412c, and 412d. This increases the threshold voltages of the two vertical transistors created by cutting the original vertical transistor 130,140,150b with the two STI regions 210a and 210b.

Figure 5:
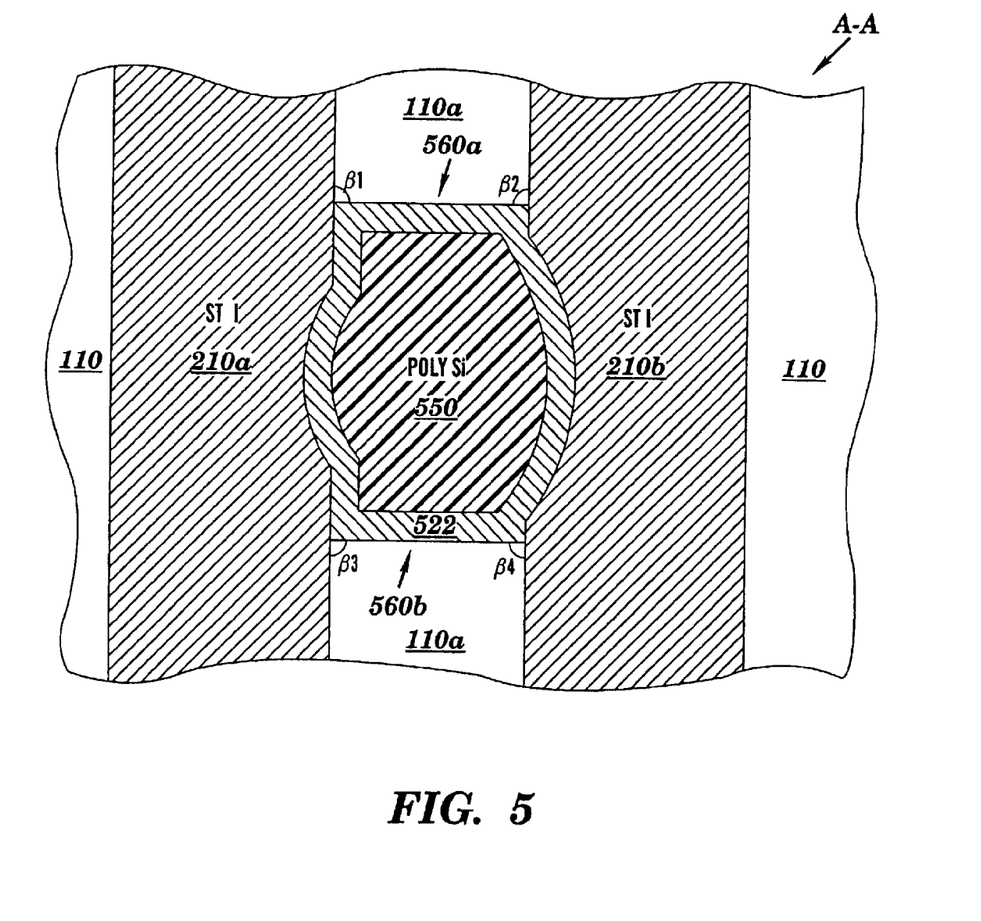

FIG. 5 illustrates the structure 100 of FIG. 4 after a gate dielectric layer 522 is deposited or formed by oxidation inside the hole 310 and then the hole 310 is filled completely with poly Si to form a poly Si gate 550 of the two vertical transistors described above. It should be noted that the angles $\alpha 1, \alpha 2, \alpha 3$ and $\alpha 4$ (FIG. 3) formed between the north side wall 314a and south side wall 314b of the hole 310 and the abutting surfaces 412a, 412b, 412c, and 412d of the two STI regions 210a and 210b are sharp (less than 90 degrees). However, in FIGS. 4 and 5, these angles $\alpha 1, \alpha 2, \alpha 3,$ and $\alpha 4$ become angles $\beta 1, \beta 2, \beta 3,$ and $\beta 4$, respectively, which are all 90 degrees and therefore much less sharp. In other words, in FIG. 5, the channel regions 560a and 560b of the two vertical transistors created from the original vertical transistor 130,140,150b by the two STI regions 210a and 210b have less sharp corners. As a result, the threshold voltages Vt of the two vertical transistors are higher and tightly distributed in its value across a chip compared with FIG. 2.

In the embodiments described above, to simplify the description, the n+ regions 130 and 140 (FIG. 1A) are described as the source and drain of the vertical transistor 130,140,150b, respectively. In general, each of the n+ regions 130 and 140 can be used as a source and the other can be used as a drain of the vertical transistor 130,140, 150b.

In the embodiments described above, $NH_4OH$ is used. In general, any chemical that can directionally remove Si without reacting with dielectric materials can be used. Other hydroxide chemistries such as NaOH or KOH also fall into this category, but the chemistries are not limited to hydroxide chemistries.

In the embodiments described above, the dielectric spacer 122c is thick so as to reduce the capacitive coupling between the source/drain region 140 and gate region 550b. In one embodiment, the step of forming the spacer 122c can be omitted. As a result, the poly Si regions 150b and 150c can be formed in one step by completely filling the DT 120 with poly Si. Therefore, only the thin gate dielectric layer 522 isolates the source/drain region 140 and gate region 550b. This may result in large capacitive coupling which reduces transistors performance.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A method for fabricating a vertical semiconductor structure, the method comprising the steps of:
   providing a semiconductor substrate comprising a semiconductor material;
   forming a deep trench in the semiconductor substrate;
   depositing a first gate dielectric layer on a side wall of the deep trench;
   filling the deep trench with a filling material;
   forming a first source/drain region and a second source/drain region around and along the depth of the deep trench;
   forming first and second shallow trench isolation regions sandwiching the deep trench in an active region, the first and second shallow trench isolation regions abutting the active region via first and second abutting surfaces, respectively, wherein the first and second abutting surfaces are parallel to each other and are perpendicular to an orientation plane of the semiconductor material of the substrate;
   removing the first gate dielectric layer so as to expose the semiconductor material in the deep trench to the atmosphere;
   chemically etching the exposed semiconductor material in the deep trench;
   depositing a second gate dielectric layer on a side wall of the deep trench; and
   forming a gate terminal for the vertical semiconductor structure in the deep trench.

2. The method of claim 1, wherein a top surface of the substrate is perpendicular to the orientation plane of the semiconductor material of the substrate.

3. The method of claim 1, wherein the step of filling the deep trench comprises the steps of:
   forming a storage node at a bottom of the deep trench; and
   forming a trench top oxide layer over the storage node in the deep trench,
   wherein the first source/drain region is at a top of the substrate and the second source/drain region is at about the level of the trench top oxide layer.

4. The method of claim 3, wherein the storage node being in physical contact with the semiconductor material outside the deep trench such that thermal diffusion of dopants from the storage node forms the second source/drain region.

5. The method of claim 3, further comprising the step of forming a collar oxide around the storage node so as to reduce the vertical leakage current from the second source/drain region along with side wall of the deep trench when the storage node is charged positively.

6. The method of claim 3, wherein the trench top oxide layer is thicker than the first gate dielectric layer.

7. The method of claim 1, wherein the step of filling the deep trench comprises the step of forming a dielectric spacer at the top of the deep trench.

8. The method of claim 1, wherein the step of removing the first gate dielectric layer so as to expose the semiconductor material in the deep trench to the atmosphere comprises the steps of:
   removing the filling material from the deep trench until the first gate dielectric layer is exposed to the atmosphere; and
   etching the first gate dielectric layer until the semiconductor material is exposed to the atmosphere in the deep trench.

9. The method of claim 1, wherein the step of chemically etching the exposed semiconductor material in the deep trench is performed until the exposed semiconductor material recesses to a plane parallel to the orientation plane.

10. The method of claim 1, wherein the step of chemically etching the exposed semiconductor material in the deep trench comprises the step of etching with ammonia hydroxide.

11. A vertical semiconductor structure, comprising:
    first and second shallow trench isolation regions formed in a substrate comprising a semiconductor material; and
    a first vertical transistor formed in the substrate and sandwiched between the first and second shallow trench isolation regions, the first vertical transistor including first and second source/drain regions, a first channel region, a gate region, and a first gate dielectric layer sandwiched between the gate region and the first channel region,
    wherein the first channel region abuts the first and second shallow trench isolation regions via first and second abutting surfaces, respectively, and
    wherein the first and second abutting surfaces are perpendicular to an orientation plane of the semiconductor material of the substrate.

12. The structure of claim 11, wherein the first gate dielectric layer abuts the first channel region via a third abutting surface, wherein the third abutting surface is parallel to the orientation plane.

13. The structure of claim 12, wherein a top surface of the substrate is perpendicular to the orientation plane.

14. The structure of claim 12, further comprising a second vertical transistor formed in the substrate and sandwiched between the first and second shallow trench isolation regions, the second vertical transistor including third and fourth source/drain regions, a second channel region, the gate region, and a second gate dielectric layer sandwiched between the gate region and the second channel region, wherein the second channel region abuts the third and fourth shallow trench isolation regions via fourth and fifth abutting surfaces, respectively, and wherein the third and fourth abutting surfaces are perpendicular to the orientation plane of the semiconductor material of the substrate.

15. The structure of claim 14, wherein the second gate dielectric layer abuts the second channel region via a sixth abutting surface, wherein the sixth abutting surface is parallel to the orientation plane.

16. The structure of claim 14, wherein the first and second vertical transistors are formed around and along the depth of a deep trench.

17. The structure of claim 14, wherein a top surface of the substrate is perpendicular to the orientation plane.

18. A method for fabricating a vertical semiconductor structure, the method comprising the steps of:

providing a semiconductor substrate comprising a semiconductor material;

forming a deep trench in the semiconductor substrate;

depositing a first gate dielectric layer on a wall of the deep trench;

filling the deep trench with a filling material and recessing the filling material in the deep trench down to a recess depth;

removing the first gate dielectric layer on a side wall of the deep trench down to a level lower than the recess depth;

filing the deep trench with poly silicon and recessing the poly silicon down to a level above the recess depth;

filling the deep trench with a second dielectric layer and selectively removing the dielectric on a wall of the deep trench so as to form a trench top dielectric layer;

filling the deep trench with poly silicon;

forming a first source/drain region and a second source/drain region around and along the depth of the deep trench;

forming first and second shallow trench isolation regions sandwiching the deep trench in an active region, the first and second shallow trench isolation regions abutting the active region via first and second abutting surfaces, respectively, wherein the first and second abutting surfaces are parallel to each other and are perpendicular to an orientation plane of the semiconductor material of the substrate;

removing the first gate dielectric layer so as to expose the semiconductor material in the deep trench to the atmosphere;

chemically etching the exposed semiconductor material in the deep trench;

depositing a second gate dielectric layer on a side wall of the deep trench; and forming a gate terminal for the vertical semiconductor structure in the deep trench.

19. The method of claim 18, wherein a top surface of the substrate is perpendicular to the orientation plane.

20. The method of claim 18, wherein the step of chemically etching the exposed semiconductor material in the deep trench comprises the step of etching with ammonia hydroxide.

* * * * *